United States Patent [19]
Farrar

[11] Patent Number: 4,918,824
[45] Date of Patent: Apr. 24, 1990

[54] ELECTRONIC DIGITAL COMPASS

[75] Inventor: James G. Farrar, Lighthouse Point, Fla.

[73] Assignee: International Navigation, Inc., Opa-Locka, Fla.

[21] Appl. No.: 253,780

[22] Filed: Oct. 5, 1988

[51] Int. Cl.$^5$ ............................................. G01C 17/30
[52] U.S. Cl. ....................................... 33/361; 324/244
[58] Field of Search ............. 33/361, 357, 362, 363 R, 33/363 Q; 324/247, 244, 253-255, 251, 209

[56] References Cited

U.S. PATENT DOCUMENTS

| | | |
|---|---|---|
| 3,400,328 | 9/1968 | Penn et al. . |
| 4,503,621 | 3/1985 | Fowler .................................. 33/361 |
| 4,520,311 | 5/1985 | Petr et al. . |
| 4,528,481 | 7/1985 | Becker et al. .................... 324/244 X |
| 4,587,487 | 5/1986 | Zanzucchi . |
| 4,591,786 | 5/1986 | Koo et al. . |
| 4,591,788 | 5/1986 | Mohri et al. . |
| 4,600,885 | 7/1986 | Koo et al. . |
| 4,687,993 | 8/1987 | Mermelstein . |
| 4,769,599 | 9/1988 | Mermelstein ....................... 324/244 |

FOREIGN PATENT DOCUMENTS 31825 11/1960 Japan .................................. 324/253

OTHER PUBLICATIONS

"Influence of Applied Tensile and Compressive . . . ", Kinoshita et al., IEEE MAG-22, No. 5, Sep. 1986.
"Bistable Magnetic Magnetization Reversal in 50 um Diameter . . . ", Malmhall et al., IEEE MAG-23, No. 5, Sep. 1987.
Letter from Isamu Ogasawara to J. G. Farrar dated Jul. 1, 1989, (not prior art).
"Magnetic Domains of Twisted Amorphous Ribbons", Livingston et al., MAG-20, No. 5, Sep. 1984.
"Sensitive Bistable Magnetic Sensors Using . . . ", Mohri et al., Applied Physics, vol. 53, No. 11, Nov. 1982.
"Pulse-Output Type Magnetic Sensors, Using . . . ", Mohri et al., MAG-19, No. 5, Sep. 1983.
Gordon et al., IEEE Trans. on Magnetics, MAG 1, No. 4, Dec. 1965, "Factors Affecting Sensitivity of Gamma Level Ring Core, etc.".
S. V. Marshall, IEEE Trans. on Magnetics, MAG 6, No. 2, Sep. '67, "An Analytic Model for the Flux Gate Magnetometer".
F. Primdahl, IEEE Trans. on Magnetics, MAG 6, No. 2, Jun. 1970, "The Gating Curves of Parallel and Orthogonal Flux-Gates".
J. R. Burger, IEEE Trans. on Magnetics, MAG 8, No. 4, Dec. 1972, "The Theoretical Output of a Ring Core Flux Gate Magnetometer".
D. I. Gordon, IEEE Trans. on Magnetics, MAG 8, No. 1, Mar. 1972, "Recent Advances in Flux-Gate Magnetometry".
H. D. Gardner, NASA Langly Research Center, LA-R-13560, "Improved Flux-Gate Magnetometry".
Hilzinger, IEEE Trans. on Magnetics, MAG 19, No. 5, Sep. 1983, "Applications of Metallic Glasses in the Electronics Industry".
Mohri et al., IEEE Trans. on Magnetics, MAG 19, No. 5, Sep. 1983, "Magnetomer Using Two Amorphous Core Multivibrator Bridge".

(List continued on next page.)

*Primary Examiner*—Harry N. Haroian
*Attorney, Agent, or Firm*—Jerry A. Miller

[57] ABSTRACT

An electronic digital compass utilizes an amorphous magnetostrictive wire 100 1 exhibiting reentrant behavior as a core. A sense wiring 104 is wrapped about the core and the core is driven with a triangular wave through a drive coil 102. The earth's magnetic field biases the core 100 such that when the core 100 is driven to reentrant jumps the time duration between adjacent pulses induced into the sense winding 104 is related to the heading. A pair of such arrangements are used in physical 90 degree relationship to resolve ambiguities in heading angle. The resulting heading angle calculation is a true digital product which is independent of analog amplitude variations and requires little or no adjustment for high accuracy.

39 Claims, 12 Drawing Sheets

OTHER PUBLICATIONS

Mohri, IEEE Transactions on Magnetics, MAG 20, No. 4, Sep. 1984, "Review of Recent Advances in the Field of Amorphous Metal etc.".

Boll et al., IEEE Trans. on Magnetics, MAG 19, No. 5, Sep. 1983, "Comparison of Amorphous Materials, Ferrites, and Permalloys".

Mohri et al., IEEE Trans. on Magnetics, MAG 20, No. 5, Sep. 1984, "Jitter-Less Pulse Generator Elements Using Amorphous etc.".

Mohri et al., IEEE Trans. on Magnetics, MAG 21, No. 5, Sep. 1985, "Large Barkhausem Effect and Matteucci Effect in Amorphous etc.".

Kinoshita et al., IEEE Trans. on Magnetics, MAG 22, No. 5, Sep. 86, "Influence of Applied Tensile and Compressive Stress on etc.".

Bajorek et al., IEEE Trans. on Magnetics, MAG 12, No. 6, Nov. 1976, "A Permalloy Current Sensor".

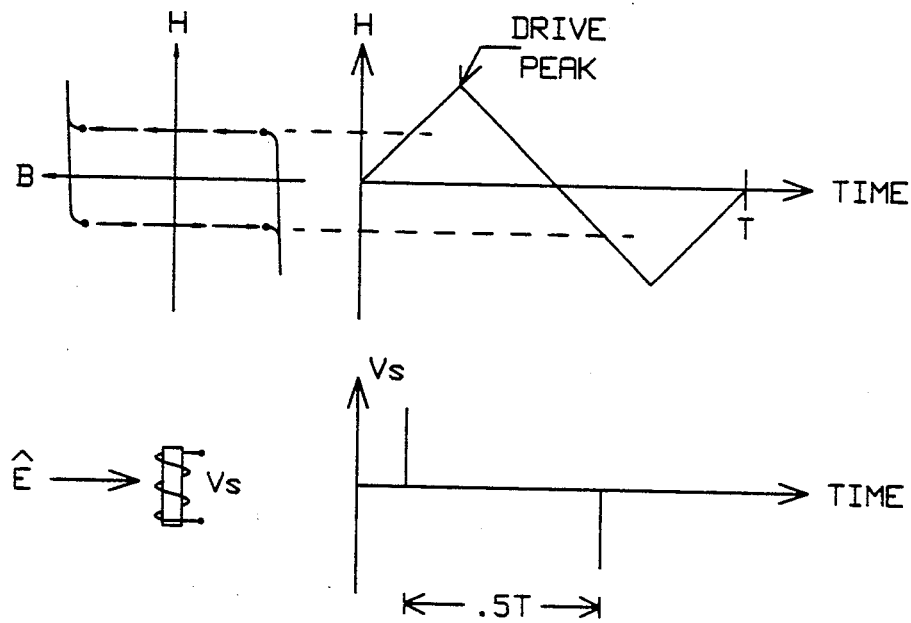
FIG.13
FIG.14
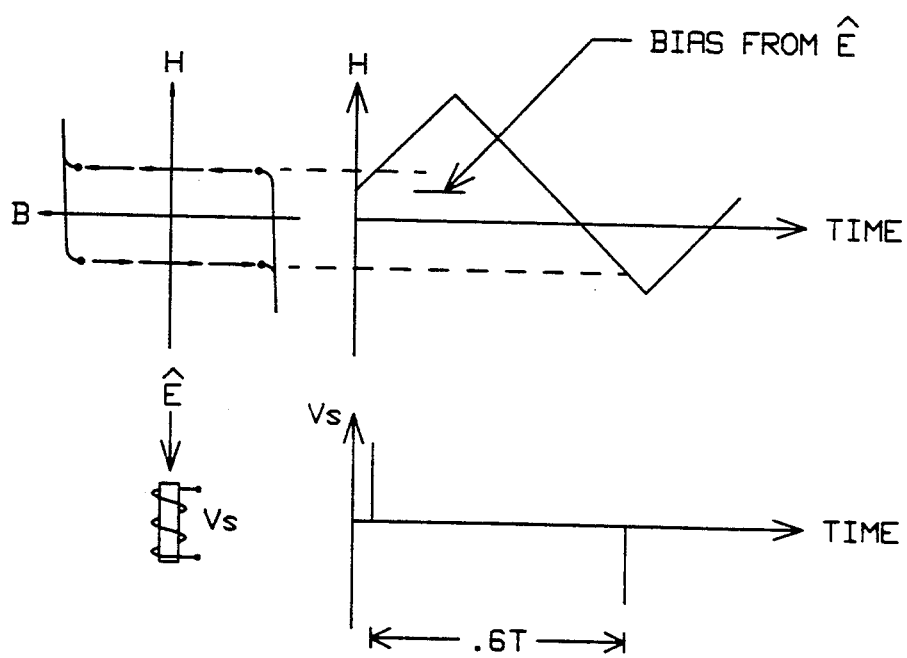

ELECTRONIC DIGITAL COMPASS

BACKGROUND

1. Field of the Invention

This invention relates generally to an instrument that provides the magnetic direction of a vehicle to which it is mounted for navigation purposes, and more specifically to an Electronic Digital Compass system that senses, computes, and displays the vehicle's magnetic direction digitally.

2. Background of the Invention

The most fundamental vehicle navigation requirement is the direction in which the vehicle is traveling, and for about the last 2000 years the most fundamental navigation instrument has been the magnetic compass. For the great majority of its existence the compass has been a mechanical instrument that has slowly evolved over its great life span. The advent of an electronic compass did not occur until the 20th century, with its great electronic revolution.

The electronic compass is a single example of a general class of instruments called magnetometers, and more specifically it is classified as a vector magnetometer. This is because the earth's magnetic field is a 3 dimensional vector and the purpose of the compass is to determine the vehicles direction (magnetic heading) relative to the two horizontal components of this vector field.

While there have been many forms of magnetometers developed, most electronic compass systems use what is called a flux-gate magnetometer. The flux-gate vector magnetometer is based upon a high permeability core material where the earth's field, external to the core and along its axis, is alternately pulled into and released from the core material. This is what is referred to as gating the external field.

A complete analysis of the flux-gate mechanism has been reported by a number of authors, for example: D. I. Gordon, et al., IEEE Transactions On Magnetics, MAG 1, No. 4, Dec. 1965, "Factors Affecting the Sensitivity of Gama-Level Ring Core Magnetometers"; S. V. Marshall, IEEE Transactions On Magnetics, MAG 3, Sept, 1967, "An Analytic Model For the Flux-Gate Magnetometer"; F. Primdahl, IEEE Transactions On Magnetics, MAG 6, No. 2, June 1970, "The Gating Curves of Parallel and Orthogonal Flux-Gates"; J. R. Burger, IEEE Transactions On Magnetics, MAG 8, No. 4, Dec. 1972, "The Theoretical Output of a Ring Core Flux-Gate Magnetometer"; and D. I. Gordon et al., IEEE Transactions on Magnetics, MAG 8, No. 1, Mar. 1972, "Recent Advances in Flux-Gate Magnetometry". The basics of the flux-gate theory will be explained by the following.

FIG. 1 shows the general shape of a B-H curve 10 of a typical soft magnetic material that would be used as the core material in flux-gate magnetometers. Mumetal, permalloy, or super-mallow are examples of these high permeability materials. The B-H curve 10 shows the relationship of the magnetic field (H) on the horizontal axis applied to the core versus the magnetic flux (B) induced in the core on the vertical axis. When used in a flux gate magnetometer the permeability state of the core is what causes the gating action. The permeability is related to B and H by:

permeability = $u = B/H$

As can be seen from the B-H curve 10, at high values of H the flux density B stays approximately constant. That is, the core is said to be saturated, and in this saturated state the permeability of the core is small. In a second state the core is not saturated, which results in the value of the permeability being high.

Turning now to FIG. 2, in the high permeability, unsaturated state, the core material 12 acts as a low impedance path to the earth's magnetic flux lines 14 that lie along the core's axis, and the flux 14 is drawn into the core 12. In the other state of the core 12, when it is saturated and therefore of low permeability, the core 12 no longer presents a low impedance path to the flux 14 so it returns to the area outside of the core. This is shown in FIG. 3. These two distinct states of the core, the pulling, in of the earth's magnetic flux, and letting it return to its original position is the gating of the flux of the earth's field.

Both FIGS. 2 and 3 show a sense coil 16 wound around the core 12. When the core 12 changes from the saturated state to the unsaturated state and the earth's magnetic field flux is pulled into the core, the flux lines 14 "cut" (pass through) the turns of the sense coil 16 and induce a voltage pulse in the coil 16. When the core 12 then passes into the saturated state and the flux 14 leaves the core 12 a voltage pulse of equal amplitude, but of opposite polarity is induced. The amplitude of these pulses are directly proportional to the magnitude of that vector $\hat{E}$ the earth's magnetic field which lies parallel to the axis of the sense coil and core. It should also be noted that the polarity of the pulses depends upon the direction of the earth's field vector $\hat{E}$ with respect to the sense coil 16 and core 12.

Turning now to FIG. 4, as stated before, the gating of the flux is accomplished by having two distinct states of the core material. In order to control the state of the core a second coil 18, which is called the drive coil 18 is added around the core 12. This drive coil 18 is driven with an alternating current of sufficient amplitude to drive the core 12 from the saturated state through the unsaturated state and into the saturated state in the opposite direction.

FIG. 5 shows the relationship of the alternating drive current in the drive coil 18 to the sense voltage pulses produced in the sense coil 16 as the core 12 is rotated relative to the earth's magnetic field vector E. The amplitude of the induced sense coil voltage pulses is proportional to:

$$Vs1 \propto E^*\cos(\theta)$$

where:

Vs1 = Amplitude of induced sense pulses.
E = Magnitude of earth's field vector $\hat{E}$
$\theta$ = Angle of core relative to earth's field vector $\hat{E}$.

From this equation it can be seen that the same amplitude and polarity of the pulses will occur at two separate angles ($\theta$) as the core is rotated through 360 degrees. To resolve this ambiguity a second core, with sense and drive coils, is placed at a 90 degree angle with the first core. This 90 degree physical space relationship of the second core relative to the first means that its induced sense coil voltage will be proportional to:

$$Vs2 \propto E^*\sin(\theta)$$

and since:

$$\tan(\theta) = \frac{E * \sin(\theta)}{E * \cos(\theta)}$$

Then the heading of a vehicle, to which these orthogonal cores would be mounted as an electronic compass, can be calculated with:

$$\theta = \text{ArcTan}(Vs2/Vs1)$$

Again from this equation it is seen that an electronic compass based upon a flux-gate magnetometer utilized the amplitude and phases of the voltages induced into the sense windings to calculate the heading of the vehicle.

When FIG. 5 is studied it is evident that each sense coil produces two pulses for each cycle of the alternation drive current. Thus the output of the sense coil is a waveform containing a large component of the second harmonic of the drive current. A magnetometer operating in this mode is called a second harmonic flux-gate magnetometer and is by far the most popular version in use at this time.

It can also be seen, when looking at FIG. 4, that the alternating current applied to the drive winding 18 will be induced into the sense winding 16, inundating the small pulses produced by gating the external field. Over the years there have been various strategies of core, sense coil, and drive coil configurations for saturating the core without inducing the drive signal into the sense winding. These strategies fall into two categories, parallel and orthogonal core configurations.

In the parallel configurations as shown in FIG. 6, the drive current is applied in opposite directions to two parallel cores 20 and 22, so that the resulting field seen by the sense winding(s) is effectively canceled. With experience these separate parallel cores have evolved into a toroidal core configuration as shown in FIG. 7 which again is the most popular version in use at this time.

In another variation shown in FIG. 8, known as orthogonal configurations, the saturating field generated by the alternating drive current is directed at right angles to the sense coil and so cannot induce a voltage into it. In the embodiment on the left, a tubular core is wound with a drive coil 18. In the embodiment on the right, a ferromagnetic wire 24 is driven by drive current applied to terminals 26.

As was stated before, a magnetometer operating as described is called a second harmonic flux-gate magnetometer. The performance at this second harmonic frequency is usually enhanced by capacitively tuning the sense coil to this frequency. This tuning also further discriminates against components of the drive signal which might still be induced into the sense coil.

While tuning of the sense coil can enhance the second harmonic signal it can also affect the accuracy of the compass system. Unless both sense coils are accurately tuned to exactly the second harmonic of the drive frequency, amplitude variations and large phase shifts of the second harmonic signals will be generated between the two axis outputs. Since the calculated heading is proportional to the ratio of the two amplitudes, any variation in one signal relative to the other will be seen as an error in the calculated heading.

When a second harmonic flux-gate magnetometer is being used as the sensor for an electronic digital compass, the circuitry required to produce a digital reading of the magnetic heading of a vehicle from the output of the magnetometer fall into two categories. The first is called amplitude conversion, and the second is called phase conversion.

A block diagram of a general amplitude conversion scheme is shown in FIG. 9. A square wave drive signal generated by a signal generator 30 is applied to the drive coil 32 which is coupled to the core 34. Two tuned second harmonic signals from orthogonal sense windings 36 and 38, tuned respectively by tuning capacitors 40 and 42, are directed to two parallel amplitude signal processing paths. The first block of signal processing in each path is a switching demodulator 46 and 48 that is driven by two times the core drive frequency from frequency multiplier 50. These demodulator blocks effectively do a full wave rectification of the second harmonic output of the sense windings, while preserving the amplitude information of the signal. It is at this point where large errors in the heading reading can be introduced if both sense windings 36 and 38 are not exactly tuned to the second harmonic of the drive frequency. Large phase shifts result from small differences between the resonant frequency of the tuned sense coils and frequency of the second harmonic drive signal. The demodulators 46 and 48 convert these phase variations into amplitude variations, thereby modifying the information carrying variable, signal amplitude.

The second block of each path is usually a low pass filter and a gain stage 54 and 56 respectively. The low pass filter turns the full wave rectified signal into a DC signal, and the gain amplifies it to a level required for further signal conversion. This DC gain is usually variable, so that differential amplitude errors between the two separate paths can be adjusted out.

The next blocks in each path are analog to digital converters 58 and 60 respectively which take the DC voltages that are proportional to either the sine or cosine of $\theta$ and convert them to two digital words.

These two digital words are then directed to a microprocessor 62 where the following calculation is performed:

$$\theta = \text{ArcTan}(\sin\theta/\cos\theta)$$

Usually the microprocessor 62 also does software filtering, data formatting, etc. and transmits the digital heading reading to a display 64.

A block diagram of a phase conversion scheme is shown in FIG. 10. A general description of the theory of this conversion technique can best be explained with equations.

The output signals from the two tuned sense windings 36 and 38 are proportional to:

$$Vs1 \propto E^*\cos\theta^* \sin(2wt) = A^*\sin(2wt)$$

$$Vs2 \propto E^*\sin\theta^* \sin(2wt) = B^*\sin(2wt)$$

where:
Vs1 = Second harmonic sense signal from core 1.
Vs2 = Second harmonic sense signal from core 2.
E = Magnitude of the earth's field.
$\theta$ = Heading of the vehicle.
w = Two Pi times the drive frequency.
and:
A = E*$\cos\theta$
B = E*$\sin\theta$ The signal from the second sense winding 36 is then phase shifted by 90 degrees at twice the drive frequency at phase shifter 70. That is:

$$Vs2_{90} \propto B^*\sin(2wt+90) = B^*\cos(2wt).$$

The 90 degree phase shifted output of sense coil 36 is then added to the output of coil 38 at summer 72. This sum becomes:

$$Vt = Vs1 + Vs2_{90}$$

$$Vt = (A^*\sin(2wt)) + (B^*\cos(2wt))$$

which by phaser addition becomes:

$$Vt = C^*\sin(2wt+D)$$

where:

$$C = SQRT(A^2 + B^2)$$

$$\sin(D) = B/SQRT(A^2+B^2)$$

with SQRT being the square root function. Knowing that:
$A = E^*\cos\theta$
$B = E^*\sin\theta$
then:
$C = SQRT(A^2+B^2)$
$C = SQRT(E^2\cos^2\theta + E^2\sin^2\theta)$
$C = E^*SQRT(\cos^2\theta + \sin^2\theta)$
$C = E^*SQRT(1) = E$
and:

$$\sin D = B/SQRT(A^2+B^2) = B/C$$

$\sin D = E^*\sin\theta/E = \sin\theta$
therefore:
$D = \theta$
and:

$$Vt = E^*\sin(2wt+\theta).$$

From this equation it can be seen that the heading information contained in the amplitudes of the two sense signals is converted to a phase shift between the converted signal and two times the drive signal. This phase shift is detected by detector 74 and the phase shift is converted to a time difference pulse at the output of detector 74. This output is timed by a counter 76 which is driven by a crystal 78 controlled clock. The counter output is processed by microprocessor 62 which drives display 64. While this scheme combines the information wanted, that it heading $\theta$, early in the signal processing scheme, it also is vulnerable to tuning causing errors in the heading reading it produces.

The large phase shifts that result from small differences between the resonant frequency of the tuned sense coils and the second harmonic of the drive signal show up as errors in $\theta$. Also the 90 degree phase shift circuit must accurately give 90 degrees, even if the drive frequency changes slightly, or more errors will be introduced. And finally, the gain of the two paths up to and through the point of summing must be balanced, or still more errors will be added to the heading reading.

After the summing point in the phase conversion scheme, the combined signal's phase shift relative to the second harmonic of the drive signal is converted to a time difference and used to count a reference clock with a counter 76 as described above. The number in the counter is now proportional to $\theta$ and is then directed to a microprocessor 62. The microprocessor 62 again does software filtering, data formatting, and sends the digital reading of heading to the display 64.

From the preceding discussion it can be seen that up to now electronic digital compass systems have really been an extension of analog flux-gate systems that have been in use since before the second world war. In general it can be said that they are analog sensors to which an analog to digital conversion is applied to obtain a digital output. The largely analog processing schemes are prone to introduction of errors from many sources, and require substantial tuning for accuracy. The conversion schemes may vary as described above, but the heading information is still contained as an analog amplitude output from the sensor.

In U.S. Pat. No. 4,591,788 to Mohri et al, a sensor for magnetic field sensing uses a twisted ribbon of amorphous magnetic material to produce a pulse in response to the presence of a external magnetic field similar to the so called "Wiegand wire effect." In essence, this device converts a zero magneto-striction material to a low magnetostriction material by introduction of physical stresses into the material. This device appears only useful in measurement of alternating magnetic fields whereas the present invention measures constant fields such as the earth's magnetic field. In particular, the device appears to be useful in measuring the frequency of AC magnetic fields.

In U.S. Pat. No. 4,687,993 to Mermelstein, an amorphous magnetostrictive ribbon is used to transfer strain to an optical fiber. This strain changes the optical length of the fiber and can be used to measure magnetic fields by measuring the phase shift of light passing through the fiber. The ribbon does not appear to exhibit or use reentrant behavior.

In U.S. Pat. No. 4,520,311 to Petr et al, in conjunction with IEEE Transactions On Magnetics, MAG-12, No. 6, November 1976, entitled "A Permalloy Current Sensor", pp 813–815 (this paper is referenced in the Petr patent), a magnetoresistive bridge is described which produces a 30 Oe wide pulse implying that the device could not have the resolution required for an electronic compass. In these references, a triangular wave drive is used as a reference and when the field to be measured crosses the level of this reference, an output is produced. Since the strongest level of the earth's magnetic field is approximately 0.68 Oe at the magnetic North Pole, Petr's device is clearly incapable of accurately measuring it. The Petr device is apparently intended for large field measurement.

The present invention provides an improved electronic compass, magnetometer and sensor therefor which is implemented by very simple circuitry and is capable of producing extremely accurate measurements without electrical alignment and without encountering many of the error sources of the prior art.

SUMMARY OF THE INVENTION

The present invention has as its primary objective the provision of improved method and apparatus for an electronic digital compass.

It is a more particular objective to provide for a low cost direct digital conversion of the earth's magnetic field vector to a digital reading of the magnetic heading of a vehicle using the invention.

It is another object and advantage of the present invention to provide an improved method and apparatus for measuring small constant magnetic fields such as the earth's magnetic field by a largely digital technique independent of analog variations.

Further aspects of the invention are to include a vector magnetic field sensor the output of which is not an amplitude variable signal, but rather a time variable signal; to provide sensor core assemblies, which contain core material, sense coil, and drive coil windings, in a simple form without the problem of induced drive signal in the sense coil output; and to provide a signal conversion scheme which does not require tuning of the sense coil winding.

Further the invention will provide a high accuracy of reading without the need for amplitude, phase, or zero set adjustments.

According to one embodiment of the present invention, an apparatus for sensing a magnetic field, includes a magnetostrictive core capable of exhibiting reentrant behavior. A drive circuit induces the reentrant behavior in the core and a sense coil senses changes in magnetic flux occurring when the core exhibits reentrant behavior.

In another embodiment, an apparatus for sensing the direction of a magnetic field, includes a first amorphous magnetostrictive core capable of exhibiting reentrant behavior and a second amorphous magnetostrictive core capable of exhibiting reentrant behavior, the second core being disposed at a 90 degree angle with the first core. A drive coil induces the reentrant behavior in the first and second cores. A pair of sense coils sense changes in magnetic flux in the first and second cores occurring when the cores exhibit the reentrant behavior.

A method of sensing a direction of a magnetic field, according to the present invention, includes the steps of inducing reentrant jumps in a first and a second magnetic core, the first core physically disposed 90 degrees from the second core; detecting a duration of time between the jumps in the first core ΔT1 and between jumps in the second core ΔT2; and computing the direction of the magnetic field with respect to the axis from the duration of time between the jumps.

In another embodiment, an electronic digital compass, includes a first amorphous magnetostrictive core capable of exhibiting reentrant behavior and a second amorphous magnetostrictive core capable of exhibiting reentrant behavior, the second core being disposed at a 90 degree angle with the first core. A drive circuit induces the reentrant behavior in the first and second cores by driving the cores with a magnetic field having periodic characteristics of period T. A pair of sense coils sense changes in magnetic flux in the first and second cores occurring when the cores exhibit the reentrant behavior. A measuring circuit measures times ΔT1 and ΔT2 between adjacent changes in magnetic flux occurring in each of the first and second cores respectively. A computer computes a heading θ as:

$$\theta = \text{ArcTan} \frac{\Delta T2 - T/2}{\Delta T1 - T/2},$$

where T/2 is a constant. A display displays the heading angle θ. In a variation of this embodiment a third amorphous magnetostrictive core capable of exhibiting reentrant behavior, the third core being disposed at a 90 degree angle with the first and second cores so that the first, second and third core are each orthogonal to one another. In this embodiment, the driving circuit induces the reentrant behavior in the third core and a sensing coil senses changes in magnetic flux in the third core occurring when the core exhibits the reentrant behavior.

In another embodiment of the electronic compass a first amorphous magnetostrictive wire core capable of exhibiting reentrant behavior and a second amorphous magnetostrictive wire core capable of exhibiting reentrant behavior are disposed at a 90 degree angle with each other. A driving circuit induces the reentrant behavior in the first and second cores by driving a pair of series connected drive coils disposed about the cores with an electrical current having a triangular waveform of period T. A first and a second sensing coil wrapped about the first and second cores senses changes in magnetic flux in the first and second cores occurring when the cores exhibit the reentrant behavior by producing voltage pulses when the flux passes through the first and second coils, the voltage pulses being either positive or negative depending upon the direction of movement of the flux. An amplifier receives the voltage pulses, and amplifies them. A comparing circuit, receiving the amplified voltage pulses from the amplifying means, compares the amplified voltage pulses to a pair of voltage references and produces therefrom a pair of pulses t1 and t2 corresponding to negative going and positive going amplified voltage pulses respectively. A counting circuit measures times ΔT1 and ΔT2 between adjacent changes in magnetic flux occurring in each of the first and second cores respectively, where $\Delta T1 = t2 - t1$ for the first core and $\Delta T2 = t2 - t1$ for the second core. A computer computes a heading θ as:

$$\theta = \text{ArcTan} \frac{\Delta T2 - T/2}{\Delta T1 - T/2},$$

where T/2 is a constant; and a display displays the heading angle θ.

In a magnetic field sensing device according to the present invention, a magnetic core is capable of exhibiting reentrant behavior. A clock supplies a source of regular time intervals. A drive circuit is synchronized with the clock and induces reentrant jumps in the core. A sensing circuit senses the reentrant jumps. A counter is also synchronized with the clock and counts a number of counts occurring between adjacent reentrant jumps.

The features of the invention believed to be novel are set forth with particularity in the appended claims. The invention itself however, both as to organization and method of operation, together with further objects and advantages thereof, may be best understood by reference to the following description taken in conjunction with the accompanying drawing.

BRIEF DESCRIPTION OF THE DRAWINGS

FIG. 13 illustrates the generation of pulses from a triangular drive signal driving a sensor as in FIG. 12 when the earth's field vector $\hat{E}$ is perpendicular to the core wire.

FIG. 14 illustrates the generation of pulses from a triangular drive signal driving a sensor as in FIG. 12 when the earth's field vector $\hat{E}$ is parallel to the core wire.

DETAILED DESCRIPTION OF THE INVENTION

In recent years new forms of magnetic materials have been developed by rapid quenching a magnetic material alloy melt with cryogenic liquids or a jet water stream. The metals that are produced in the manner are called amorphous materials because they do not exhibit the crystalline structure of normal soft magnetic materials, but have a homogeneous structure more like glass. In fact, many in the magnetic industry refer to these amorphous magnetic materials as metallic glasses.

Of the many forms of the alloys that have been produced, some exhibit magnetostrictive properties that result in what is referred to as a reentrant behavior. In more technical terms this reentrant behavior is often called the "Large Barkhausen and Mattencci Effects".

The preferred embodiment of the invention uses magnetostrictive alloy amorphous cylindrical wires which are 125 um in diameter, 7.6 cm long, and which exhibit reentrant behavior as the core material in the magnetic field sensor. Such wire may be obtained, for example from Unitika Co., 23 Kozakura, UJI 611, Japan. The length and diameter of the wire, while not generally critical, is selected to assure that the reentrant behavior is not quenched. With this particular wire, a minimum length (L) of about 5 cm is needed to assure that the reentrant jumps are not quenched, but this may vary and is not to be limiting. Those skilled in the art will appreciate that just as many variations of the sensors of second harmonic flux gate magnetometer sensors have evolved in the past, many variations of the present design may be possible as new materials and forms of reentrant material evolve, without departing from the present invention.

Figure 1:
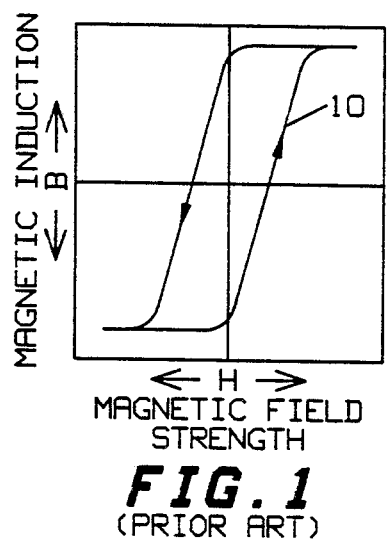
FIG. 1 shows a B-H curve for a flux gate magnetometer core material.
Figure 2:
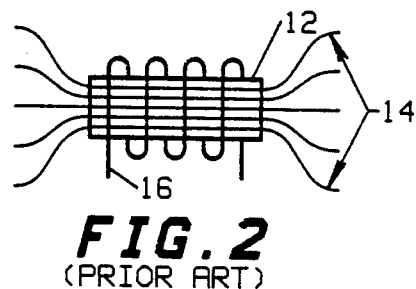
FIG. 2 shows the effect of an unsaturated core on the flux lines of the earth's magnetic field.
Figure 3:
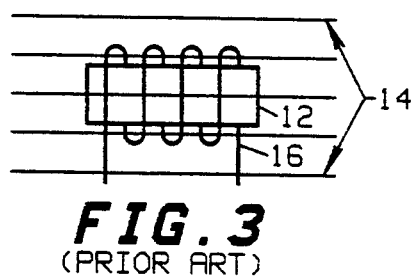
FIG. 3 shows the effect of a saturated core on the flux lines of the earth's magnetic field.
Figure 7:
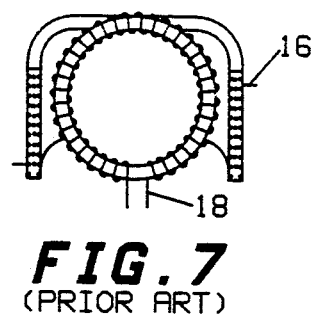
FIG. 7 shows a toroidal coil sensor for a flux gate magnetometer.
Figure 4:
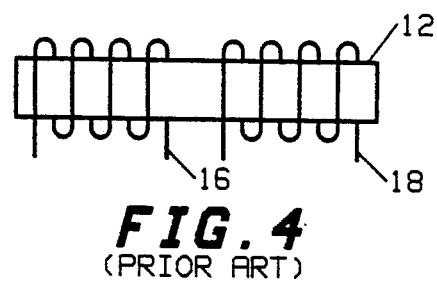
FIG. 4 shows an elementary core drive arrangement for a flux gate magnetometer sensor.
Figure 6:
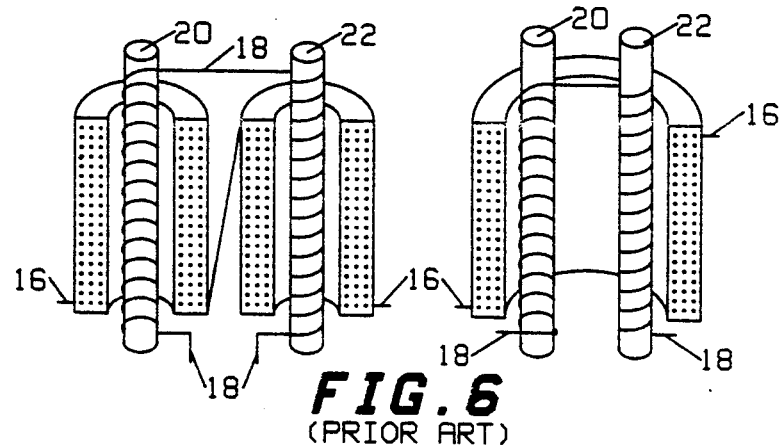
FIG. 6 illustrates the parallel configuration sensor for a flux gate magnetometer.
Figure 5:
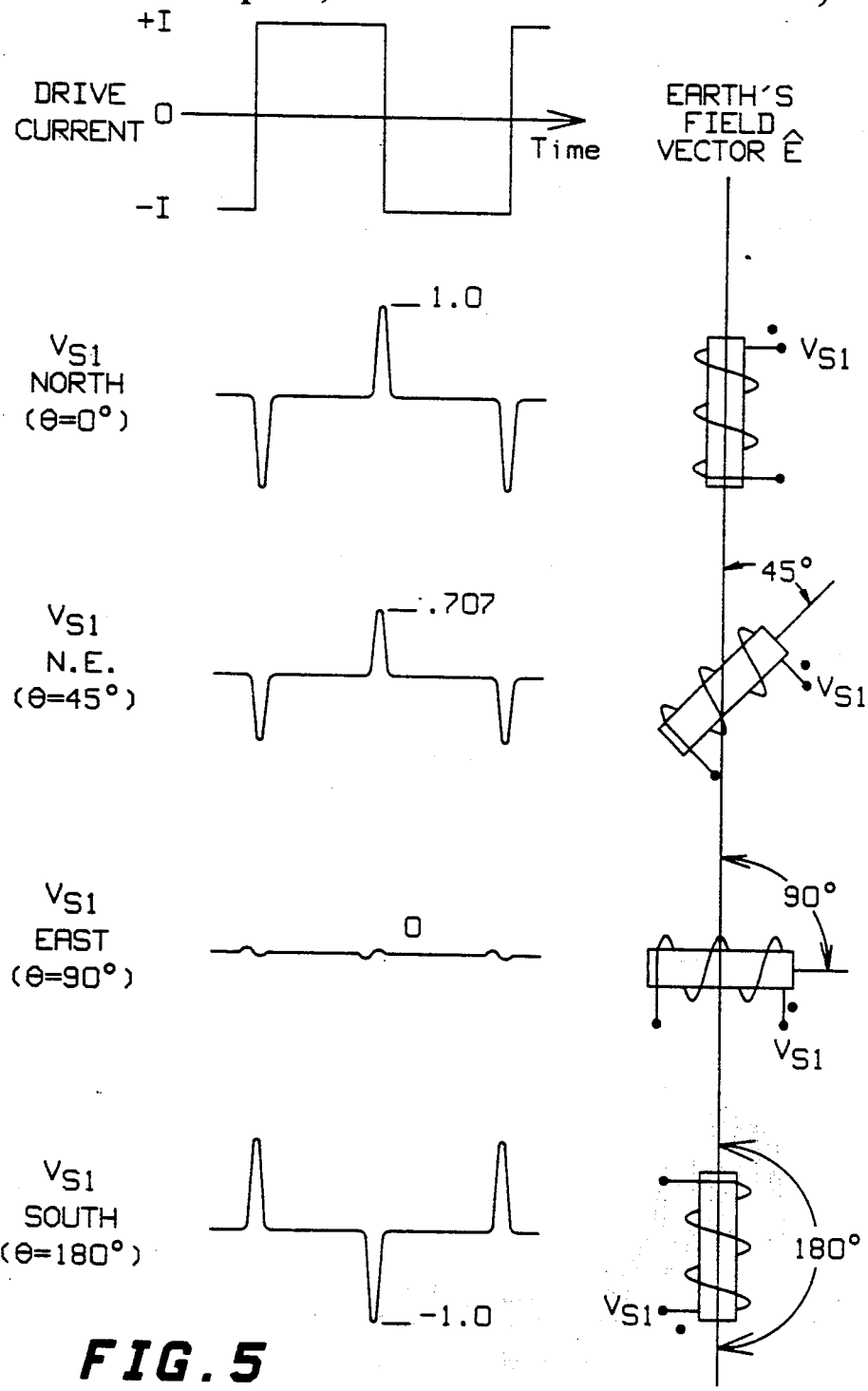
FIG. 5 shows the sense voltage versus earth's field for a conventional flux gate magnetometer sensor.
Figure 8:
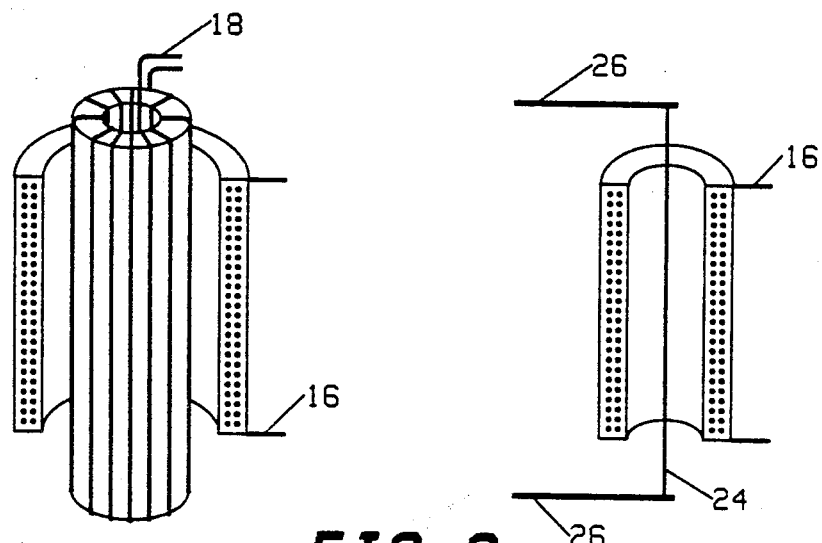
FIG. 8 illustrates the orthogonally driven arrangement for a flux gate magnetometer sensor.
Figure 11:
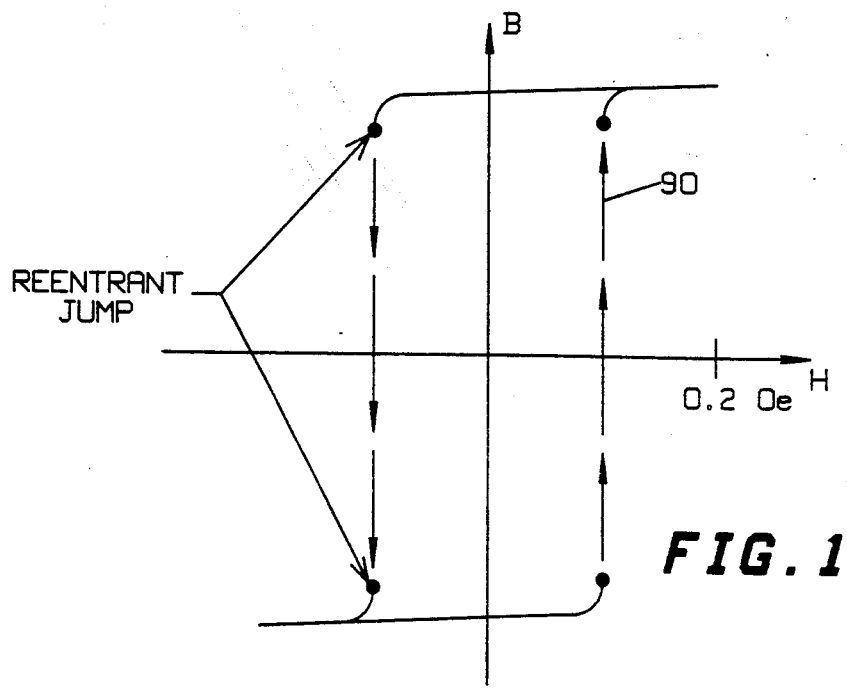
FIG. 11 shows a B-H curve for amorphous core material which exhibits reentrant behavior of the present invention.
Figure 9:
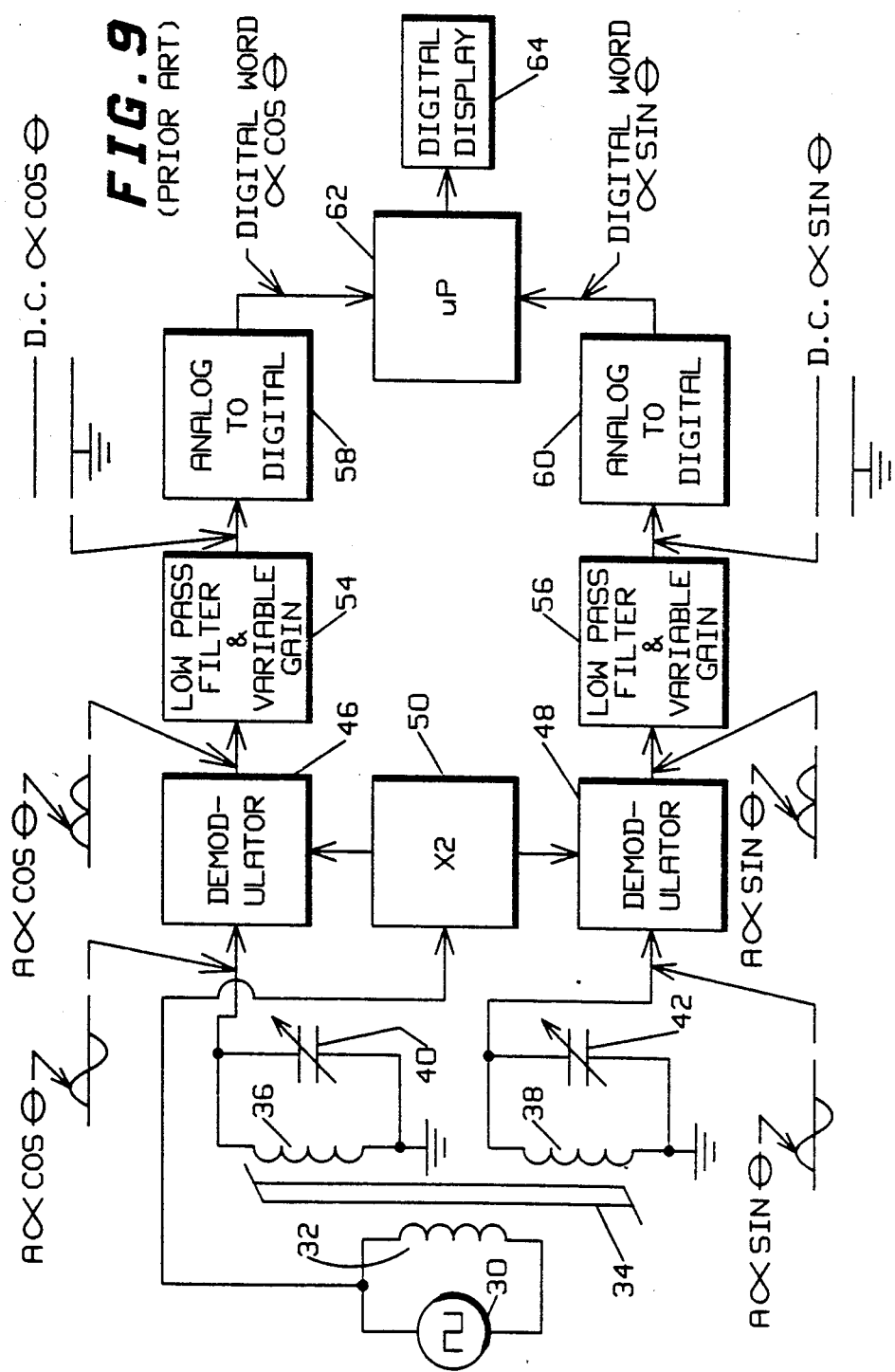
FIG. 9 shows a block diagram of amplitude conversion circuitry.
Figure 10:
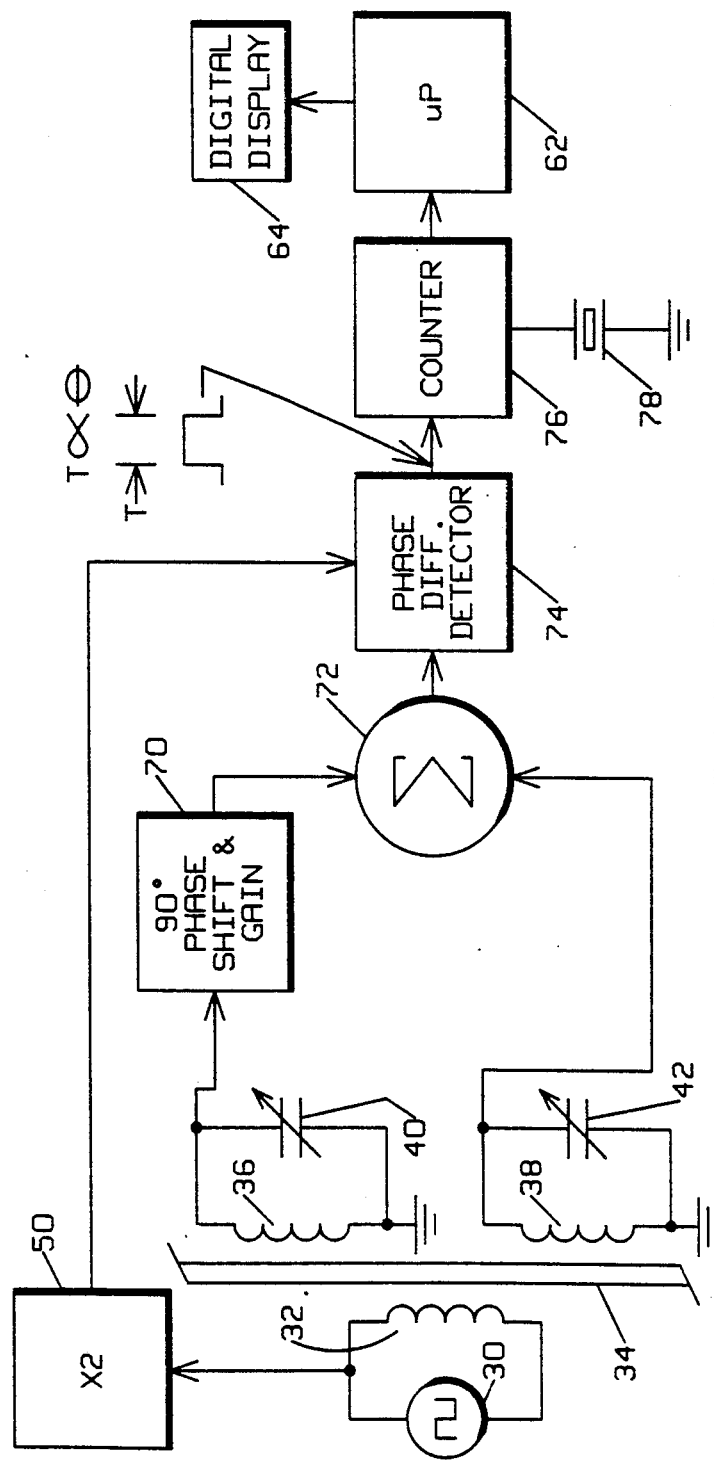
FIG. 10 shows a block diagram of phase conversion circuitry.

A normal B-H curve for a common soft magnetic material was shown in FIG. 1. This curve is a continuous driven function with no discontinuities. Turning to FIG. 11 the B-H curve 90 for the amorphous reentrant wire material is shown. In the saturated state this wire material is also continuous, but as the wire is driven out of saturation it reaches a drive point, at about 0.1 Oe (where Oe stands for Oersted) in samples tested, where it exhibits a discontinuity and jumps to the opposite state of saturation without any further driving function. This point is referred to as the reentrant threshold. This reentrant jump is very sharp, fast and stable.

Figure 12:
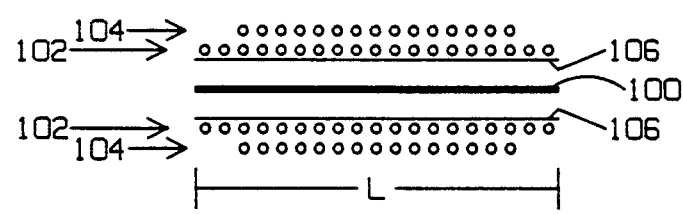
FIG. 12 shows a sensor arrangement using amorphous magnetostrictive wire exhibiting reentrant behavior.

Turning now to FIG. 12 the sensor arrangement of the preferred embodiment is shown in cross section. In the present invention a reentrant wire core 100 has a drive coil 102 and a sense coil 104 wound around it. In this case the drive coil 102 is a long solenoid winding along the total length L of the wire. In this embodiment of the invention the sense winding 104 was also wound as a solenoid winding on top of the drive winding. In this embodiment, approximately 400 turns of #36 gauge wire is used as the sense winding and approximately 500 turns of #36 gauge wire is used for the drive winding for both core assemblies. The windings are approximately 0.65 cm in diameter symmetrically spaced about the wire core 100 and wrapped around a magnetically inert and electrically nonconductive coil form 106 for mechanical support of the coils. Alternatively, a bobbin core of approximately 400 turns of #36 gauge wire can be placed at the center of the structure to produce a similar performing sense coil. In this case, the bobbin should be located close to the center to maximize the sense coil induced voltage. Of course, the above exact dimensions and specifications are not to be limiting since many variations are possible without departing from the present invention. However, it is preferable that each coil assembly used in a single magnetometer have the same specifications.

For a long solenoid coil, the field at the center of the coil, which is of constant amplitude along its axis, can be calculated using:

$$H = NI/L$$

where
  N = Number of turns.
  I = Current in the coil.
  L = Length of the coil.

Therefore, with this simple mechanical configuration of wire core and solenoid winding, it is possible to control the field driving the wire core by controlling the magnitude of the current in the drive coil.

Using FIG. 13, the basic operation of this field sensing element will be explained. (Note that the graphs of FIGS. 13 through 16 are not to scale.) The drive coil 102 has applied a triangular alternating current such that a triangular shaped time varying field is induced into the core 100. The peak field value generated at the center of the solenoid winding reaches approximately 1.0 Oe in the preferred embodiment, but this is not to be limiting since the invention only requires that the reentrant threshold for the core material be exceeded by the positive and negative peak field induced by the drive coil 102 under all conditions of bias by the earth's field so that the reentrant jump is induced. If the core 100 has no external magnetic field impressed along its axis, the amorphous wire core 100 will exhibit its reentrant jumps as the drive field increases through the approximately 0.1 Oe level in both the positive and the negative directions. The large rate of change of magnetic flux (B) that occurs at the reentrant jumps are coupled to the sense coil 104 and induces stable and sharp voltage pulses into the sense coil 104 wound around the wire core 100. Because the voltage pulses are very sharp, they exhibit a very wide spectrum of energy that extends far beyond the drive frequency. This is advantageously utilized by the present invention to inherently separate the drive signal from the sense signal.

It can be seen from FIG. 13 that if the period of the triangular drive current is T, then the time difference between the two induced sense pulses of opposite polarity is T/2 0.5T.

The magnitude of the horizontal component of the earth's field varies depending upon the position on the globe. Usually is between about 0.1 and 0.4 Oe and may be as large as about 0.68 Oe at the magnetic North Pole. In the continental United States, the value is approximately 0.2 Oe. This is the value that will be used in the explanation of how the present invention senses the earth's field.

Figure 15:
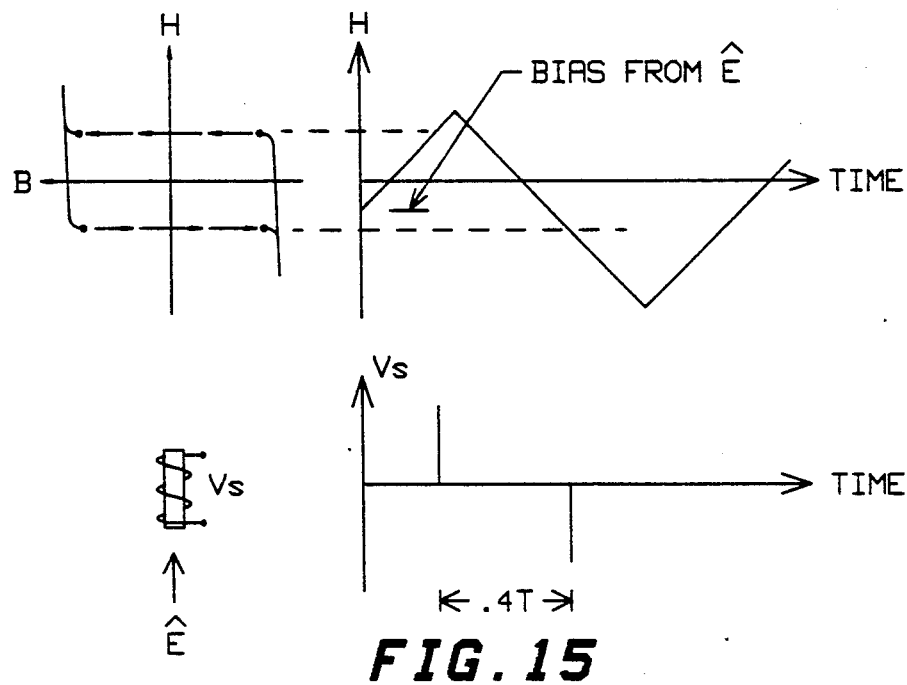
FIG. 15 illustrates the generation of pulses from a triangular drive signal driving a sensor as in FIG. 12 when the earth's field vector $\hat{E}$ is parallel to the core wire and in the opposite direction as that of FIG. 14.

If the axis of the wire core 100 is aligned with the earth's field vector $\vec{E}$, the field will act as a bias upon the field generated by the alternating triangular drive current. FIG. 14 shows what happens when the earth's field aids the drive signal (that is biases the drive field in the positive direction), and FIG. 15 shows the situation when the earth's field opposes the drive signal (that is, biases the drive field in the negative direction). From these FIGURES it is seen that the time difference between the two reentrant induced pulses varies with the magnitude of the earth's field along the axis of the wire core, and increases above T/2 for aiding fields and decreases below T/2 for opposing fields.

Figure 16:
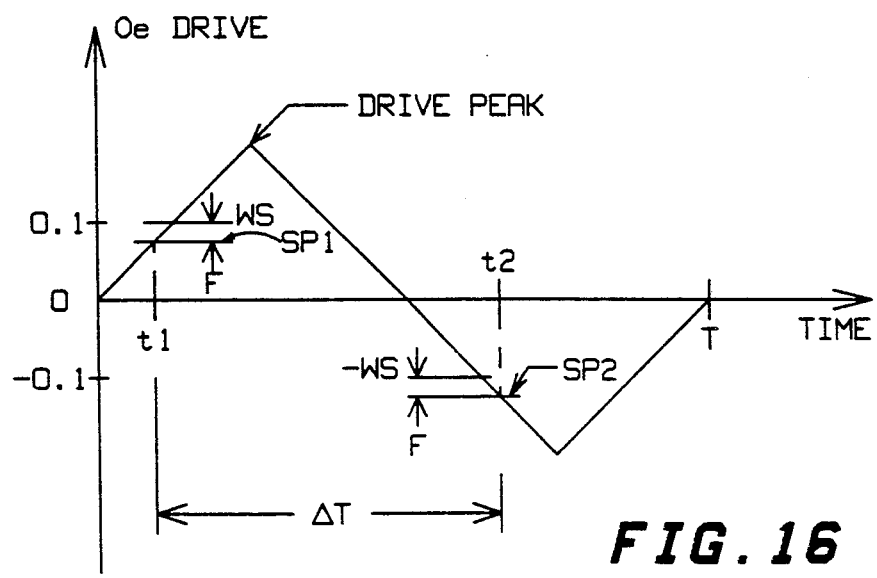
FIG. 16 is a plot of the drive signal of the preferred embodiment showing various quantities used in the calculation of heading angle $\theta$.

A detailed analysis of this field detecting mechanism will use FIG. 16. The magnitude of the triangular drive field in the first and third quadrants of the drive is a function of time expressed by:

$$Oe \text{ drive} = \frac{1.0 * t}{T/4} = \frac{4 * t}{T}$$

and therefore:

$$t = \frac{T * Oe \text{ drive}}{4}$$

where:
Oe drive=Drive field level at the center of the solenoid drive coil.
T=Period of the alternating drive field.
t=time along the horizontal axis.

When a field of magnitude F is along the wire core, the wire exhibits its reentrant jumps at the following relative drive field magnitudes:

$$|SP1| = WS - F$$

$$|SP2| = WS + F$$

where:
|SP1|=Absolute magnitude of the drive field for the wire core's first switch point.
|SP2|=Absolute magnitude of the drive field for the second wire core's second switch point.
WS=The no external field wire switching level.
F=The external field along the axis of the wire.

And again since:

$$t = \frac{T * Oe \text{ drive}}{4}$$

then from FIG. 16:

$$t1 = \frac{T * |SP1|}{4}$$

$$t1 = \frac{T * (WS - F)}{4}$$

and:

$$t2 = \frac{T * |SP2|}{4} + \frac{T}{2}$$

$$t2 = \frac{T * (WS + F)}{4} + \frac{T}{2}.$$

The time difference between the two pulses ΔT is:

$$\Delta T = t2 - t1$$

$$\Delta T = \frac{T * (WS + F)}{4} + \frac{T}{2} - \frac{T * (WS - F)}{4}$$

$$\Delta T = \frac{T * WS}{4} + \frac{T * F}{4} + \frac{T}{2} - \frac{T * WS}{4} + \frac{T * F}{4}$$

$$\Delta T = \frac{T * F}{2} + \frac{T}{2}$$

$$\Delta T = \frac{T}{2} * (F + 1).$$

It is seen that:

a. No Field  $F = 0$   $\Delta T = .5T$
b. Aiding   $F = +0.2$  $\Delta T = .6T$
c. Opposing $F = -0.2$  $\Delta T = .4T.$ These are the values shown in FIGS. 13, 14, and 15.

Figure 17:
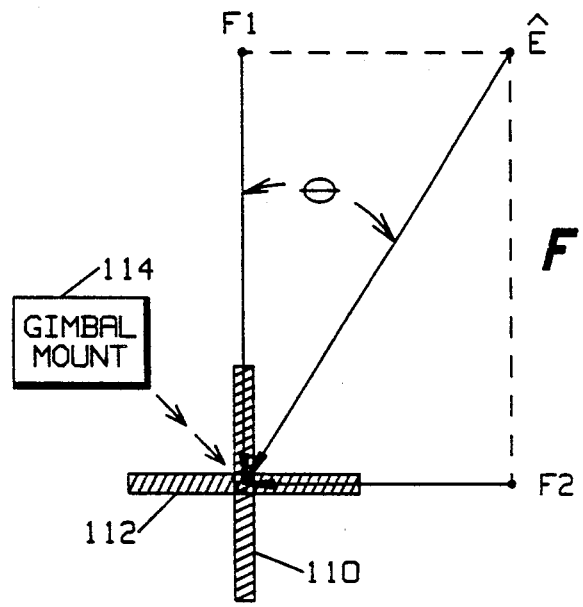
FIG. 17 illustrates the field levels along each orthogonal axis of the sensor.

When this type of field sensing element is to be used as a digital compass, a second orthogonal wire core, drive coil, and sense coil must be added. FIG. 17 illustrates this configuration, from which the field along each of the two orthogonal wire axis can be calculated. This FIGURE schematically represents a first sensor 110 and a second sensor 112 which are physically displaced by 90 degrees as shown. The two sensors should be accurately physically related to each other by 90 degrees for maximum accuracy. The sensors should be mounted in such a manner, for use as an electronic compass, to assure that they are kept horizontally oriented with respect to the earth. This may be accomplished by any known method such as gimbal 114 mounting (represented schematically), float mounting and the like, so that the horizontal component of the earth's field is the only measured component. In this FIGURE:

$$F1 = |E| * \cos(\theta)$$

$$F2 = |E| * \sin(\theta)$$

where:
F1=The component of the earth's field vector along the first axis.
F2=The component of the earth's field vector along the second axis.
|E|=Magnitude of the earth's horizontal field vector.
θ=The angle of the earth's horizontal field vector relative to the first axis. It is also the heading (θ) if axis 1 is mounted along the axis of the vehicle.

Substituting these equations into the equations for time difference the equation for heading is found by:

$$\Delta T1 = \frac{T * (F1 + 1)}{2} = \frac{T * |E| * \cos(\theta)}{2} + \frac{T}{2}$$

$$\Delta T2 = \frac{T * (F2 + 1)}{2} = \frac{T * |E| * \sin(\theta)}{2} + \frac{T}{2}$$

where:
ΔT1=Time difference for axis 1.
ΔT2=Time difference for axis 2.
Therefore:

$$\frac{T * |E| \cos(\theta)}{2} = \Delta T1 - \frac{T}{2}$$

and:

$$\frac{T * |E| \sin(\theta)}{2} = \Delta T2 - \frac{T}{2}$$

and since:

$$\text{Tan}(\theta) = \frac{\sin(\theta)}{\cos(\theta)}$$

$$\text{Tan}(\theta) = \frac{\Delta T2 - T/2}{\Delta T1 - T/2}$$

and therefore the heading is:

$$\theta = \text{ArcTan} \frac{\Delta T2 - T/2}{\Delta T1 - T/2}.$$

In other words the heading (θ) is found by taking the Arctangent of the ratio of the time differences, minus a constant, of each axis.

In looking at this equation the statement that T/2 is a constant could be argued since any variation in drive frequency would apparently change T/2. The following description of the preferred embodiment of the invention will show how T/2 can be fixed as a constant.

One of the simplest electronic methods of measuring a time difference is to use a counter that has a standard frequency switched into the counter at time t1 and switched off of the counter at time t2. After the frequency which is being counted is switched off at t2, the count number contained in the counter will be directly proportional to the time difference:

$$\Delta T = t2 - t1.$$

Figure 18:
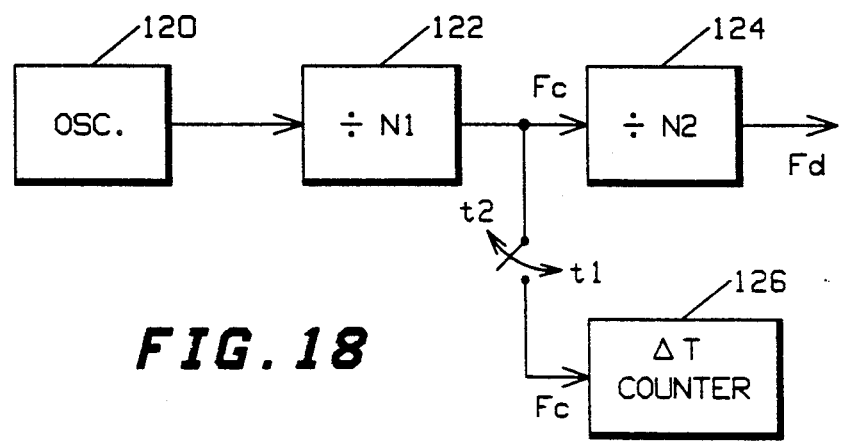
FIG. 18 is a block diagram of the frequency generation scheme of the preferred embodiment.

FIG. 18 shows the preferred embodiment of the frequency generation scheme used in the invention to keep:

$$T/2 = K = \text{a constant.}$$

In FIG. 18 a basic oscillator 120 is the start for the frequency generation scheme. The output of this oscillator 120 is then divided by N1 in a frequency divider 122 to get the frequency to be counted to determine ΔT. This frequency to be counted is then directed to two separate counters. The first is a fixed divide by N2 counter 124, the output of which is used as the source for the drive signal for the cores (after further processing). The second counter is a switched input counter 126 that contains a count proportional to ΔT. At time t1, the switch is closed to direct Fc into counter 126. At time t2 the switch opens to cease channeling Fc into the counter 126. From FIG. 18 it can be seen that:

$$Fc = \frac{Fosc}{N1}$$

where:
Fc=Frequency to be counted.
Fosc=Oscillator frequency.
N1=First fixed divide number.
Also:

$$Fd = \frac{Fc}{N2}$$

where:
Fd=Core drive frequency.
N2=Second fixed divide number.

To convert T/2 to an equivalent count in the ΔT counter the time T/2 is multiplied by the frequency to be counted. That is we can define:

$$C_{T/2} \stackrel{d}{=} \frac{T}{2} * Fc$$

where:
$C_{T/2}$=Count in the ΔT counter after a T/2 time count.
And since:

$$T = 1/Fd$$

$$\frac{T}{2} = \frac{1}{2 * Fd}$$

$$\frac{T}{2} = \frac{N2}{2 * Fc} = \frac{N2 * N1}{2 * Fosc}$$

then:

$$C_{T/2} = \frac{N2 * N1 * Fosc}{2 * Fosc * N1}$$

$$C_{T/2} = N2/2 = \text{a constant } (K).$$

From these equations it can be seen that T/2 as converted by the ΔT counter will be a constant and equal to N2/2. Therefore, because of this method of frequency generation, the accuracy of the system is completely independent of the accuracy of the oscillator used as the basic time reference for the system. It should also be noted that if the peak value of the drive signal is adjusted to change the slope of the triangular drive signal, the accuracy is not affected as such, except that the absolute count of the counter will change. Thus the amount of drive is relatively unimportant except to the extent that the resolution of the counter may be affected since the absolute count may change. This resolution is also affected by the change in the magnitude of the earth's magnetic field. For example, in a place where the earth's magnetic field is 0.26 Oe, the maximum axis count $\Delta T$ (20,643) minus the constant $T/2$ (16,384) is equal to 4259 counts of the counter in the preferred embodiment (as will become clear shortly). The maximum axis count for this calculation is readily determined as follows:

$$C_{max} = T^*(F_{max}+1)^*Fc = \text{maximum } \Delta T \text{ count}$$

where:
$F_{max}$ = maximum field
$Fc$ = Frequency to be counted.
And:

$$C_{max} = N2^*N1^*(F_{max}+1)^* Fc/(2^* Fosc).$$

In the preferred embodiment:
$C_{max} = (32,768)^*(12)^*(0.26+1)^*(10^6)/(2^*12^*10^6)$ $C_{max} = 20,643$
$C_{max} - T/2 = 20,643 - 16,384 = 4259.$ This is equal to the denominator for the ArcTan calculation. Thus, the maximum resolution for this embodiment is:
Resolution = ArcTan(1 count/4259 counts) = 0.0134 degrees.

Similarly, near the magnetic North Pole, at say 89 degrees magnetic latitude, the horizontal component of the earth's field is:

$$0.68^*\cos(89 \text{ degrees}) = 0.01187 \text{ Oe}$$

and the maximum counter count is:
$C_{max} = (32,768)^*(12)^*(0.01187+1)^*(10^6)/(2^*12^*10^6)$
$C_{max} = 16,578.$
So:

$$C_{max} - T/2 = 16,578 - 16,384 = 194 \text{ counts}$$

Or:
$(4259)^*(0.01187 \text{ Oe}/0.26 \text{ Oe}) = 194 \text{ counts.}$
Thus, the resolution near the magnetic North Pole becomes:
Resolution = ArcTan( 1 count/194 counts) = 0.295 degrees.
Of course, achieving this accuracy is dependent upon actually measuring only the horizontal component of the earth's magnetic field.

Figure 19:
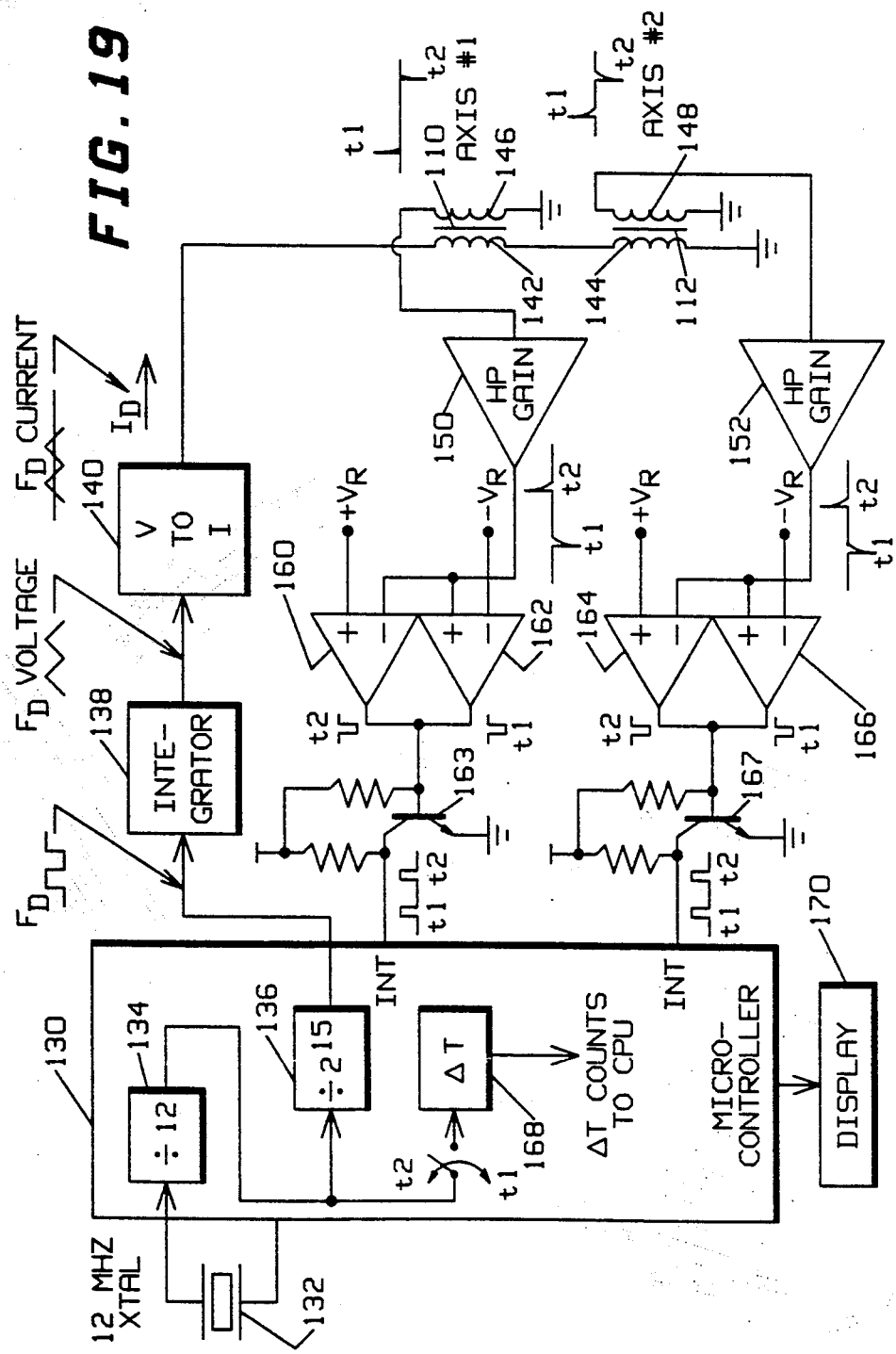
FIG. 19 is a block diagram of the magnetometer of the present invention.

A block diagram of the preferred embodiment of the invention is shown in FIG. 19. The major component of this electronic digital compass is a type of microprocessor that is sometimes referred to as a microcontroller 130. This is because in addition to the normal computing capabilities found in microprocessors it also has additional functions such as counters and/or analog to digital converters integrated onto the chip. The particular microcontroller used in the preferred embodiment is the model 80C51 manufactured by Intel which contains two separate counters. Other members of the MCSTM-51 family of microcontrollers and equivalents are suitable and widely available commercially. The microcontroller 130 has its own oscillator, to which a crystal 132 is added to obtain the timing functions for the Central Processing Unit (CPU). In the preferred embodiment this crystal controlled oscillator is also used as the basic oscillator in the frequency determining scheme to keep $T/2 = K$ (a constant).

The crystal frequency is then divided by 12 by internal divider 134 to obtain the timing functions required for CPU operations, and this frequency is also used as the frequency to be counted in the frequency scheme. Therefore if Fosc = 12 MHz and N1 = 12 then:

$Fc = 1.0$ MHz.

The value of N2 used in the preferred embodiment was set as:

$N2 = 2^{15} = 32,768$ therefore:

$$Fd = \frac{Fc}{N2} = 30.52 \text{ Hz}$$

and:

$$T/2 = K = 32,768/2 = 16,384 = \#4000 \text{ Hex.}$$

The maximum axis count $\Delta T$ at a horizontal field level of 0.26 Oe is equal to 20,643 as used in the resolution calculation. The drive frequency Fd is obtained by use of internal divider 136. The drive frequency output from the microcontroller is a square wave at 30.52 Hz. This square wave is applied to an integrator circuit 138 that changes the square wave to a triangular voltage waveform at 30.52 Hz. This triangular voltage waveform is then used as the input to a voltage to current conversion circuit 140 that is used to drive the drive coils of the orthogonal wire cores 142 and 144 connected in series. This series drive insures that the drive fields generated inside each of the orthogonal core assemblies is virtually identical.

The two pulse outputs for each of the sense windings 146 and 148 are directed to associated high pass gain stages 150 and 152 respectively for amplification of the sharp voltage pulses to a level usable as an input to voltage comparator circuits 160, 162, 164 and 166.

At this point it is appropriate to discuss the amount of drive voltage induced into the sense windings in this the preferred embodiment of the invention. The self inductances of, and the mutual inductance between, the drive coils 142 and 144 and the sense coils 146 and 148 are all in the low microhenry range. Since the drive frequency is a low value at approximately 30 Hz, the amount of fundamental drive signal coupled to the sense coil is almost non-existent for practical purposes. When using a triangular drive signal, the harmonics of the drive signal fall off very rapidly so that there is little or no problem with the drive signal coupling to the sense coils at any significant level. The gain stages 150 and 152 at the outputs of the sense coils 146 and 148 are high pass because the sharp pulses produced from the reentrant jumps of the wire core contain a very wide spectrum of energy. It is the higher frequency components of this spectrum that contains the information that is wanted, that is the sharp leading and falling edges of the pulses.

In the preferred embodiment, the pass band gain is approximately 15 and the filtering is a simple one pole high pass configuration with a 3 db frequency of approximately 75 Hz. The filtering is not critical (possibly not necessary) and is accomplished by simple capacitive coupling to an inverting op-amp in the preferred embodiment. Of course, this is not to be limiting since many variations are possible. The gain should be adequate to boost the sense signal to levels which can be operated upon by the comparitors. The reference voltages shown in FIG. 19 (+Vr and −Vr) are selected to assure accurate selection of the falling edge of the amplified pulses from the sense coils 146 and 148 and adequate rejection of extraneous noise. The falling edges are used in the preferred embodiment since they tend to be sharper than the leading edges in the samples tested, but this is not to be limiting. In the preferred embodiment Vr is approximately 0.15 volts above and below the bias reference of the amplifier output. The comparators are model LM339 open collector output comparators manufactured by National Semiconductor, for example.

The two polarity amplified sense pulses from the high pass gain stages are each applied to one of two pairs of comparators which have OR connected outputs which are inverted prior to coupling to the microcontroller. This is accomplished in this embodiment by connecting the open collector outputs of comparators 160 and 162 together to drive the base of transistor 163 and similarly by connecting the outputs of comparators 164 and 166 together to drive the base of transistor 167. The transistors behave essentially as inverters. The inverted output of transistors 163 and 167 are coupled to two interrupt pins of the microcontroller 130. The switching points of each pair of comparators are set to a +Vr and −Vr. This ensures that each side of each pair of comparators change state at the same point on the positive going pulse and the negative going pulse. The outputs of all four comparators 160, 162, 164 and 166 are negative going pulses, which are in time coincidence with t1 and t2 of core axis #1, and t1 and t2 of core axis #2. After inversion by transistors 163 and 167, these are the inputs to the microcontroller 130 that start and stop the ΔT counter 168 for each axis.

The OR'ed outputs from the comparators are used as two separate inputs to the microcontroller 130, where all further conversion to the digital heading output is accomplished by way of software. In the preferred embodiment, the microcontroller's interrupt pins are used as inputs, but this is not to be limiting. Once the conversion is accomplished, the heading information is formatted, etc. and sent to display 170.

Figure 20:
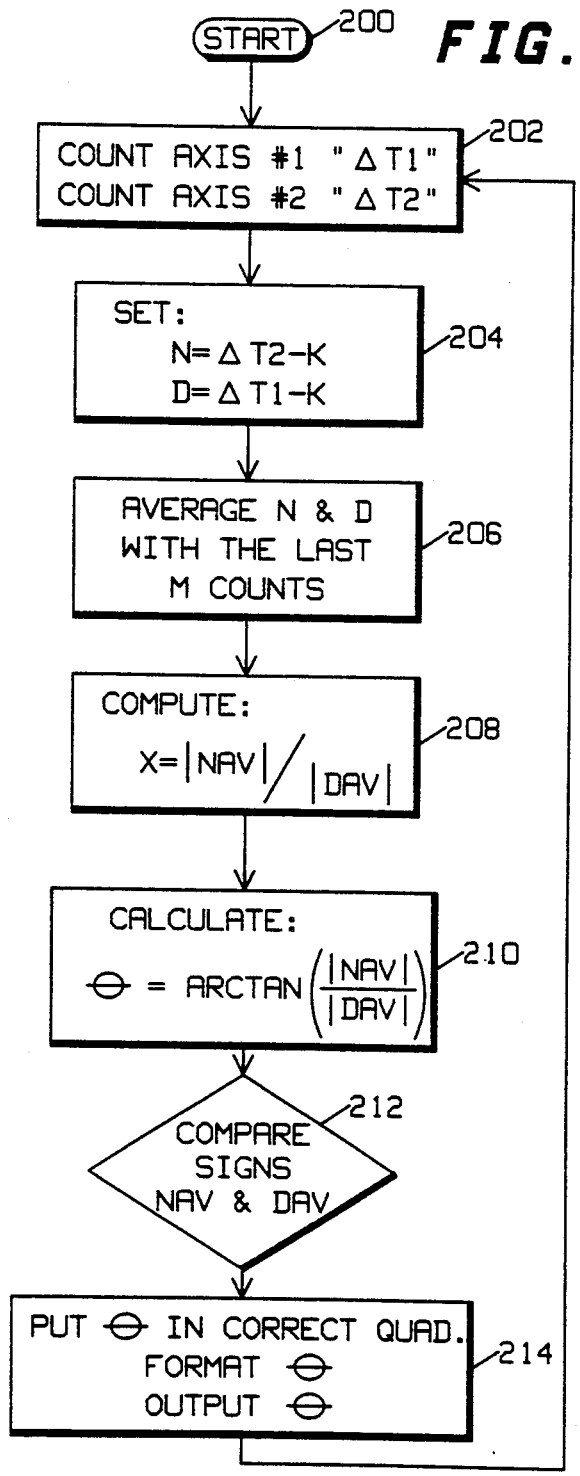
FIG. 20 is a flow chart of the operation of microcontroller of the present invention.

FIG. 20 is a general flow diagram of the program used in the preferred embodiment of the invention. The process begins at 200 with the first block of software operations 202 taking the four time pulse inputs from the comparators and using these as start and stop times for the ΔT counter. At the finish of this operation, the microcontroller contains the total counts from axis #1 (ΔT1) and axis #2 (ΔT2). In the next block 204 of software, the constant $K=N2/2$ is subtracted from each of the axis counts to obtain the numerator (N) and the denominator (D) of Tan($\theta$). The next software block 206 takes these last values of N and D and averages them with the last several (M) values of N and D to filter out any short term variations in the calculated $\theta$ reading. The number of values of M which are averaged depends upon the specific application and may be determined experimentally. For example, if only a few values are averaged, response to changes in direction of the compass will be rapid, but the readout may be somewhat jittery. If many values are averaged, the display will tend to stabilize slowly after changes in direction, but will be more immune to minor transient magnetic disturbances. A good experimental starting point is to average about the last 16 values. This number may be selected manually using a three bit word programmed by a DIP switch to range from zero to 64 or using another scheme if desired.

The next software operation 208 is to find the ratio of the averaged magnitudes of N and D. The ArcTan of this ratio is then calculated in software at 210 to find $\theta$ in the first quadrant, that is 0 to 90 degrees. The signs of both N average and D average are then compared at 212 to determine which is the correct quadrant for $\theta$, and then this correction is made. After $\theta$ is calculated, control passes to 214 where it is formatted for serial output to the digital display which may be remotely located. The software then returns to the first block 202 for the next counts and calculations. Those skilled in the art will appreciate that numerous variations of this process are possible.

Since the present microcontroller is an eight bit machine, it has been found useful to perform most of the calculations using double and in some cases triple precision to maintain accuracy.

From the preceding explanation of the preferred embodiment of the invention it can be seen that the earth's field sensor used is not an amplitude variable function, but is a time variable function. It can also be seen that the core material, drive coil, and sense coil assemblies are simple and straightforward, and that because of the conversion scheme used and the frequencies of operation, the induced drive signal into the sense output is not a problem in the invention. It has also been explained that the invention does not require tuning of the sense coil outputs to obtain the information containing signals from the sensor. And finally that the embodiment does not require amplitude, phase, or gain adjustments to obtain an accurate reading of heading $\theta$.

Figure 21:
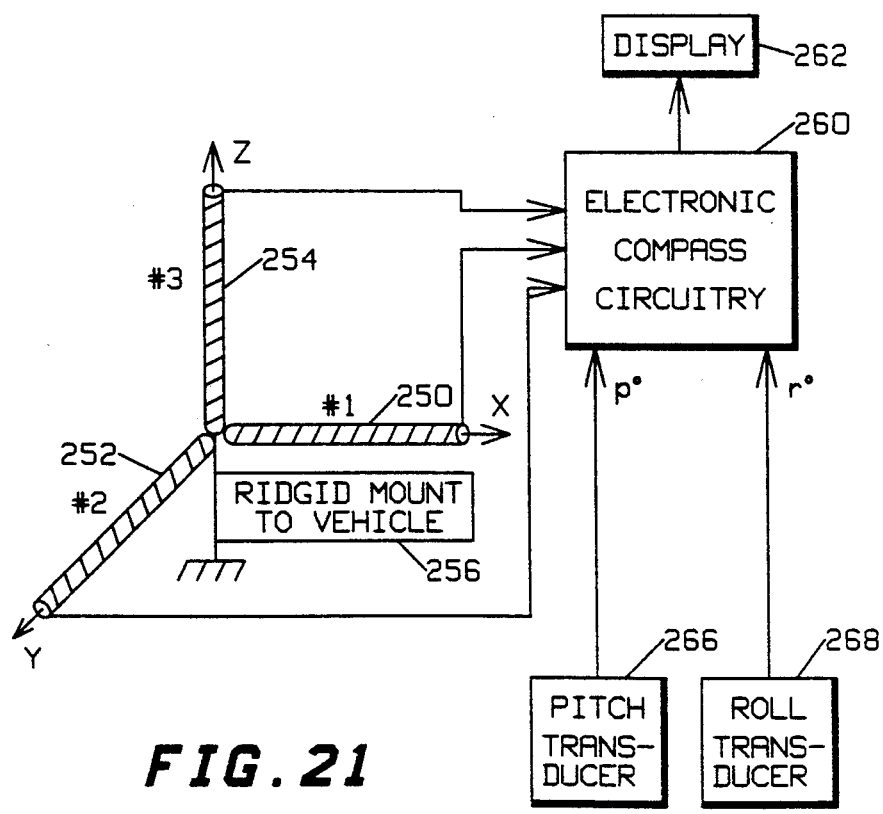
FIG. 21 shows a block diagram of an alternative embodiment of the present invention which uses pitch and roll detection in conjunction with a third orthogonal coil assembly.

In essence, the accuracy of a digital compass using the present invention is more limited by the accuracy of the mechanical mounting of the core assemblies than the electronics. In one embodiment, the mechanical mounting uses a gimbal arrangement (a two axis pendulum) to allow a balanced pair of coil assemblies to swing to the desired horizontal position. Of course, when such an arrangement is moved, it may swing out of position and momentarily be out of alignment with the horizontal. Such movement may require mechanical damping. In another embodiment, this problem can be solved by utilizing the system shown in FIG. 21. As was stated before, the invention is a vector magnetometer that resolves the horizontal component of the earth's magnetic field. It is also possible to add a third coil assembly, in a three axis orthogonal configuration shown in FIG. 21 such that the total earth's magnetic field is resolved into x, y and z components. If this three axis configuration is rigid mounted (i.e. strapped down) to the vehicle, then the three components of the total earth's field relative to the vehicle and its attitude will be resolved. If now the two variables that define the vehicle's attitude, that is pitch angle and roll angle, are coupled to the microcontroller of the electronic compass circuitry 260, then a three axis coordinate rotation calculation can be performed that will determine what the horizontal components of the earth's field would be if the vehicle was horizontal. These calculated values of x and y, that is unrotated through the vehicle's pitch and roll attitude, are then used as D and N as previously described.

In this system, coil assemblies 250, 252 and 254 are rigidly mounted in a normally horizontal plane by a rigid mounting arrangement 256. The sense output of these coil assemblies 250, 252 and 254 are coupled to electronic compass circuitry 260 which drives a display 262 similar to that shown in FIG. 19. Also coupled to the microcontroller of the electronic compass circuitry 260 are the outputs of a pitch transducer 266 and a roll transducer 268. Such instruments, generally using gyros to accurately measure pitch and roll in the presence of aircraft accelerations, are commonly available on aircrafts or could be provided as a specific part of the electronic compass. In this embodiment, the rigidly mounted sense coils 250, 252 and 254 are electronically corrected by the amount of pitch and roll indicated by the pitch and roll transducers 266 and 268. The process is briefly described by the flow chart of FIG. 22. In this embodiment, as well as the previous embodiment, the display may show heading angle alone or may also display pitch and roll angles if desired since all of this information is available to the electronic compass circuitry.

The variables of the vehicle's pitch angle and roll angle can be provided to the electronic compass as outputs from a pitch transducer 266 and a roll transducer 268. Forms of these transducers are clinometers for land and sea vehicles, and a vertical gyro for aircraft. These transducers may already be available on the vehicle, such as the aircraft gyro, or may be provided as a specific part of the electronic compass as noted above. The software modifications to the general flow diagram of FIG. 20 required for a three axis rigid mounted electronic compass with vehicle pitch and roll angle inputs and coordinate rotation calculations is shown in FIG. 22.

Figure 22:
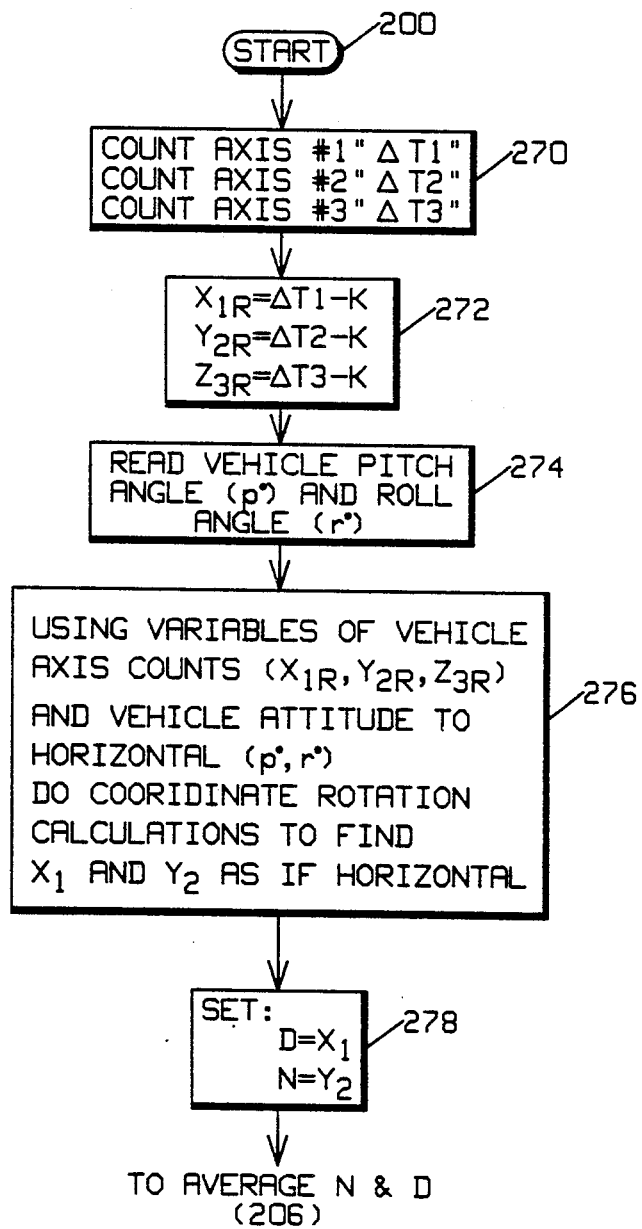
FIG. 22 shows a portion of a flow chart of operation of the embodiment of FIG. 21.

Turning now to FIG. 22, the process begins at step 200 as before. Step 270 directly replaces step 202 and receives the flow from step 214. Step 270 determines the axis counts from all three coil assemblies and passes control to step 272 which computes the axis counts less the constant K and passes control to 274. At 274, the itch and roll angles are read and control passes to 276. At 276 the axis rotation computation is performed to the determine the rotated X and Y values. Control then passes to 278 where the numerator and denominator values are set. Step 278 replaces step 204 and passes control to 206 upon completion.

It is noted that the above variations have the additional advantage of seeing a consistent set of vehicle induced magnetic field distortions. In these instances, direct current bias can be applied to the sense coils in any of the above embodiments to correct for such vehicle induced magnetic distortions. For example, if a large magnetic field or magnetic metal is nearby, it may disrupt the measurement of the earth's field in which case it can be corrected for by applying a small bias current to one or more of the appropriate sense coils. In addition, these errors due to distortion of the magnetic field can be corrected by storing correction factors or the like in ROM for use by the microcontroller during calculation of the heading angle.

While the preferred embodiment uses a triangular drive current, the drive coils can also be driven with a sinusoidal (or other) current waveform. Using a sinusoidal drive does induce errors in the reading of $\theta$, but these errors are repeatable and follow the general form of:

$$Error = A * \sin(4 * \theta calc)$$

where:
A = The maximum magnitude of the error, which is a function of the drive level, the no field switch point of the wire core, and the magnitude of the earth's field being measured. p1 $\theta$calc = Calculated $\theta$ using sinusoidal drive.

Since this error term is a repeatable function, it is possible to drive the cores with a sinusoidal current and then determine the error induced and subtract that error from the calculated $\theta$. Those skilled in the art will appreciate that other drive signals may also be used without departing from the present invention.

In hand made prototypes of the present invention, heading accuracy of well within ±0.4 percent was achieved with no electrical alignment. The error in this prototype are largely believed due to slight mechanical inaccuracies in the horizontal and orthogonal mounting of the core assemblies, etc. Still, these experimental results compare very well with conventional second harmonic flux gate magnetometers used as electronic compasses which typically quote an accuracy of within ±1.0 degrees and require substantial electronic and mechanical adjustment while using much more complex and expensive circuitry. It is anticipated that ±0.25 degree or better accuracy under most conditions can be readily achieved with proper manufacturing fixturing without need for electronic adjustment and at substantially reduced cost to manufacture.

Additional various changes to the particularly disclosed embodiments and modifications to the described practices may be introduced without departing from the invention. Thus, the preferred embodiments and methods are intended in an illustrative, and not in a limiting, sense.

Thus, it is apparent that in accordance with the present invention, an apparatus that fully satisfies the objectives, aims and advantages is set forth above. While the invention has been described in conjunction with specific embodiments, it is evident that many alternatives, modifications, variations and changes will become apparent to those skilled in the art in light of the foregoing description. Accordingly, it is intended that the present invention embrace all such alternatives, modifications, variations and changes as fall within the spirit and broad scope of the appended claims.

I claim as my invention:

1. An apparatus for sensing a magnetic field, comprising in combination:
   a magnetostrictive core which exhibits reentrant behavior;
   driving means for inducing said reentrant behavior by exposing said core to a drive magnetic field; and
   sensing means for sensing a change in magnetic flux in the form of a pulse occurring when said core exhibits said reentrant behavior as a result of exposure to said drive magnetic field and said magnetic field.

2. The apparatus of claim 1, wherein said core is a wire core.

3. The apparatus of claim 1, wherein said sensing means includes a wire coil wrapped about said wire core.

4. The apparatus of claim 1, wherein said driving means includes means for coupling a drive current through a wire drive coil wrapped about said magnetostrictive core.

5. The apparatus of claim 4, wherein said drive current has a triangular waveform.

6. The apparatus of claim 4, further comprising means for detecting the time difference between adjacent pulses induced in said sensing means by said changes of flux caused by said reentrant jumps.

7. An apparatus for sensing the direction of a magnetic field, comprising in combination:
- a first magnetostrictive core which exhibits reentrant behavior;
- a second magnetostrictive core which exhibits reentrant behavior, said second core being disposed at a 90 degree angle with said first core;
- driving means for inducing said reentrant behavior in said first and second cores by exposing said first and second cores to a drive magnetic field; and
- sensing means for sensing changes in magnetic flux in said first and second cores occurring when said first and second cores exhibit said reentrant behavior as a result of exposure to said drive magnetic field and said magnetic field.

8. The apparatus of claim 7, wherein said first and second cores are amorphous wire cores.

9. The apparatus of claim 7, wherein said driving means includes means for coupling an electrical current through a series combination of drive coils disposed about said first and second cores.

10. The apparatus of claim 9, wherein said electrical current has a triangular waveform shape.

11. The apparatus of claim 7, wherein said sensing means includes first and second coils wrapped about said first and second cores respectively.

12. The apparatus of claim 7, wherein said drive means produces a periodic signal of period T for inducing said reentrant behavior.

13. The apparatus of claim 12, further comprising:
- measuring means for measuring times $\Delta T1$ and $\Delta T2$ between adjacent changes in magnetic flux occurring in each of said first and second cores respectively; and computing means for computing a heading $\theta$ as:

$$\theta = \text{ArcTan} \frac{\Delta T2 - T/2}{\Delta T1 - T/2}.$$

14. The apparatus of claim 13, wherein said measuring means measures said times $\Delta T1$ and $\Delta T2$ by counting a number of regular pulses from a clock which occur.

15. The magnetometer of claim 13, wherein T/2 is fixed as a constant.

16. The apparatus of claim 13, further comprising means for resolving the inherent ambiguity of the ArcTan function to produce a revised value of $\theta$ which lies between 0 and 360 degrees.

17. The apparatus of claim 7, further comprising:
- a third magnetostrictive core capable of exhibiting reentrant behavior, said third core being disposed at a 90 degree angle with said first and second cores so that said first, second and third cores are each orthogonal to one another;
- wherein said driving means further induces said reentrant behavior in said third core; and wherein said sensing means senses changes in magnetic flux in said third core occurring when said core exhibits said reentrant behavior.

18. The apparatus of claim 13, further comprising correction means for correcting said heading angle $\theta$ for pitch and roll angles.

19. The apparatus of claim 18, wherein said correction means comprises:
- a pitch transducer;
- a roll transducer; and
- computing means, receiving signals from said pitch transducer and said roll transducer, for computing a heading angle $\theta$ which is corrected for said roll and pitch.

20. A method of sensing a direction a magnetic field, comprising the steps of:
- inducing reentrant jumps in a first and a second of magnetic core, said first core physically disposed 90 degrees from said second core;
- detecting a duration of time between said jumps in said first core $\Delta T1$ and between jumps in said second core $\Delta T2$;
- computing said direction of said magnetic field with respect to said axis from said duration of time between said jumps.

21. The method of claim 20, wherein said computing step comprises computing a heading $\theta$ as:

$$\theta = \text{ArcTan} \frac{\Delta T2 - T/2}{\Delta T1 - T/2}.$$

22. The method of claim 21, further comprising the step of resolving the inherent ambiguity of the ArcTan function to produce a revised value of $\theta$ which lies between 0 and 360 degrees.

23. The method of claim 21, wherein T/2 is fixed as a constant.

24. The method of claim 21, wherein said detecting step includes turning on a counter during the duration of time $\Delta T1$ to obtain a first counter value and turning on a counter during the duration of time $\Delta T2$ to obtain a second counter value, and wherein said computing step includes subtracting a known constant counter value equal to T/2 from said counter values.

25. The method of claim 21, further comprising the step of displaying said heading angle $\theta$.

26. The method of claim 21, further comprising the step of correcting said heading angle $\theta$ for pitch and roll angles.

27. The method of claim 26, wherein said correcting step comprises:
- receiving a reading from a pitch transducer;
- receiving a reading from a roll transducer; and
- computing a heading angle $\theta$ which is corrected for said roll and pitch.

28. An electronic digital compass, comprising:
- a first amorphous magnetostrictive core capable of exhibiting reentrant behavior;
- a second amorphous magnetostrictive core capable of exhibiting reentrant behavior, said second core being disposed at a 90 degree angle with said first core;
- driving means for inducing said reentrant behavior in said first and second cores by driving said cores with a magnetic field having periodic characteristics of period T;

sensing means for sensing changes in magnetic flux in said first and second cores occurring when said cores exhibit said reentrant behavior;

measuring means for measuring times $\Delta T1$ and $\Delta T2$ between adjacent changes in magnetic flux occurring in each of said first and second cores respectively;

computing means for computing a heading $\theta$ as:

$$\theta = \text{ArcTan}\frac{\Delta T2 - T/2}{\Delta T1 - T/2},$$

where T/2 is a constant.

29. The apparatus of claim 28, further comprising:
a third amorphous magnetostrictive core capable of exhibiting reentrant behavior, said third core being disposed at a 90 degree angle with said first and second cores so that said first, second and third core are each orthogonal to one another;
wherein said driving means induces said reentrant behavior in said third core; and
wherein said sensing means senses changes in magnetic flux in said third core occurring when said core exhibits said reentrant behavior.

30. The apparatus of claim 28, further comprising correction means for correcting said heading angle $\theta$ for pitch and roll angles.

31. The apparatus of claim 30, wherein said correction means comprises:
a pitch transducer;
a roll transducer; and
computing means, receiving signals from said pitch transducer and said roll transducer, for computing a heading angle $\theta$ which is corrected for said roll and pitch.

32. The apparatus of claim 28, further comprising display means for displaying said heading angle $\theta$.

33. An electronic compass, comprising in combination:
a first amorphous magnetostrictive wire core capable of exhibiting reentrant behavior;
a second amorphous magnetostrictive wire core capable of exhibiting reentrant behavior, said second core being disposed at a 90 degree angle with said first core;
driving means for inducing said reentrant behavior in said first and second cores by driving a pair of series connected coils disposed about said cores with an electrical current having a triangular waveform of period T;
sensing means, comprising a first and a second sensing coil wrapped about said first and second cores, for sensing changes in magnetic flux in said first and second cores occurring when said cores exhibit said reentrant behavior by producing voltage pulses when said flux passes through said first and second coils, said voltage pulses being either positive or negative depending upon the direction of movement of said flux;
amplifying means, receiving said voltage pulses, for amplifying said voltage pulses;

comparing means, receiving said amplified voltage pulses from said amplifying means, for comparing said amplified voltage pulses to a pair of voltage references and to produce therefrom a pair of pulses t1 and t2 corresponding to negative going and positive going amplified voltage pulses respectively;

measuring means for measuring times $\Delta T1$ and $\Delta T2$ between adjacent changes in magnetic flux occurring in each of said first and second cores respectively, where $\Delta T1 = t2 - t1$ for said first core and $\Delta T2 = t2 - t1$ for said second core;

computing means for computing a heading $\theta$ as:

$$\theta = \text{ArcTan}\frac{\Delta T2 - T/2}{\Delta T1 - T/2},$$

where
T/2 is a constant; and
means for displaying said heading $\theta$.

34. The apparatus of claim 33, wherein said computing means further includes means for correcting for the inherent ambiguity of the ArcTan function by comparing the polarity of the numerator and denominator of the quotient upon which the ArcTan is operated to produce a corrected value of $\theta$.

35. The apparatus of claim 33, further comprising:
a third amorphous magnetostrictive wire core capable of exhibiting reentrant behavior, said third core being disposed at a 90 degree angle with said first and second cores so that said first, second and third core are each orthogonal to one another.
wherein said driving means induces said reentrant behavior in said third core;
wherein said sensing means senses changes in magnetic flux in said third core occurring when said core exhibits said reentrant behavior; and
wherein said computing means includes means for performing an axis rotation so that said heading angle $\theta$ is computed for a rotated coordinate system in which the heading angle is horizontal.

36. The apparatus of claim 34, wherein said first, second and third drive coils are connected together in an electrical series connection.

37. A magnetic field sensing device, comprising:
a magnetic core capable of exhibiting reentrant behavior;
clocking means for supplying a source of regular time intervals;
drive means, synchronized with said clocking means, for inducing reentrant jumps in said core;
sensing means, for sensing said reentrant jumps;
counting means, also synchronized with said clocking means, for counting a number of counts occurring between adjacent reentrant jumps.

38. The device of claim 37, wherein said drive means induces reentrant jumps of alternating polarity and wherein said counting means counts a number of counts occurring between said jumps of alternating polarity.

39. The device of claim 37, further comprising computing means for computing a measure of said magnetic field from said count.

* * * * *